United States Patent
Morizane et al.

(10) Patent No.: US 6,818,819 B2
(45) Date of Patent: Nov. 16, 2004

(54) SOLAR CELL MODULE

(75) Inventors: Masashi Morizane, Hirakata (JP); Shihomi Nakatani, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/772,994

(22) Filed: Jan. 31, 2001

(65) Prior Publication Data

US 2001/0011552 A1 Aug. 9, 2001

(30) Foreign Application Priority Data

| Jan. 31, 2000 | (JP) | 2000-022092 |
| Jan. 31, 2000 | (JP) | 2000-022094 |
| Jan. 16, 2001 | (JP) | 2001-007564 |

(51) Int. Cl.[7] .................. H01L 25/00; H01L 31/048
(52) U.S. Cl. ................... 136/251; 136/244; 257/433
(58) Field of Search ................ 136/251, 256, 136/259; 257/183, 184, 461, 433, 436

(56) References Cited

U.S. PATENT DOCUMENTS

| 4,321,418 A | * | 3/1982 | Dran et al. | 136/251 |
| 6,034,322 A | * | 3/2000 | Pollard | 136/256 |
| 6,077,722 A | * | 6/2000 | Jansen et al. | 438/74 |
| 6,113,718 A | * | 9/2000 | Yamada et al. | 156/78 |
| 6,184,057 B1 | * | 2/2001 | Van Andel et al. | 438/66 |
| 6,222,118 B1 | * | 4/2001 | Matsushita et al. | 136/256 |
| 6,265,653 B1 | * | 7/2001 | Haigh et al. | 136/249 |
| 6,271,053 B1 | * | 8/2001 | Kondo | 438/57 |
| 6,300,556 B1 | * | 10/2001 | Yamagishi et al. | 136/251 |
| 6,307,145 B1 | * | 10/2001 | Kataoka et al. | 136/251 |
| 6,407,329 B1 | * | 6/2002 | Iino et al. | 136/251 |
| 2001/0009160 A1 | * | 7/2001 | Otani et al. | 136/251 |

FOREIGN PATENT DOCUMENTS

| JP | 60164348 A | * | 8/1985 | H01L/25/04 |
| JP | 5-85783 | | 4/1993 | |
| JP | 9-210472 | | 8/1997 | |

OTHER PUBLICATIONS

Komada et al., "Novel Transparent Gas Barrier Film Prepared by PECVD Method", 43rd Annual Technical Conference Proceedings of the Society of Vacuum Coaters (Apr. 15–20, 2000) pp. 353–356.*

* cited by examiner

Primary Examiner—Nam Nguyen
Assistant Examiner—Brian L. Mutschler
(74) Attorney, Agent, or Firm—Arent Fox, PLLC.

(57) ABSTRACT

The solar cell module of this invention reduces water reaching to a front surface glass in using a rear surface member of a resin film so as to suppress sodium deposited from the front surface glass from reaching to the front surface of the solar cell element. The solar cell module of this invention comprises a front surface glass, a rear surface resin film, a plurality of solar cell elements sealed with sealing resin between the front surface glass and the rear surface resin film, and a water transmission preventing layer arranged in a position including at least an interval part between the solar cell elements adjacent each other.

3 Claims, 5 Drawing Sheets

SOLAR CELL MODULE

BACKGROUND OF THE INVENTION

1. Field of the Invention

This invention relates to a solar cell module, particularly to a two-side incidence type solar cell module capable of entering light from both front and rear surfaces provided with transparent front and rear surface members.

2. Description of Prior Art

Because solar light is unexhausted energy, a solar cell device for directly converting light energy into electrical energy has been developed as an energy source to substitute for environmentally harmful fossil fuels such as petroleum and coal. A plurality of solar cell elements are electrically connected in series or in parallel with each other to form a solar cell module and increase their output. The solar cell module can be used as a practical energy source.

A conventional solar cell module which generates power on one side surface is so structured that a plurality of solar cell elements 110 between a front surface glass 100 and a rear surface member 101 are sealed with a transparent and insulative resin 102 such as EVA (ethylene vinyl acetate).

The solar cell element 110 contains semiconductor material such as single crystalline silicon, polycrystalline silicon, or the like, and the solar cell elements 110 are connected in series by connection member 111 of a metal thin plate such as a copper foil plate or the like. The rear surface member 101 has a lamination film with a metal foil such as an aluminum (Al) foil or the like sandwiched with plastic films so that water entrance from a rear surface can be prevented.

The solar cell module is integrally formed by sandwiching the solar cell element 110 between the front surface glass 100 and the rear surface member 101 with a resin sheet of EVA or the like of 0.4–0.8 mm in thickness interposed and heating it at a reduced pressure.

On the other hand, a two-side incidence type solar cell element has been proposed, which is so structured that an electrode on a rear surface not only an electrode on a front light incidence side is a transparent electrode. With this structure, light is incident from both of the front and rear surfaces of the solar cell element. The rear surface of this solar cell element is formed of transparent material.

In the meantime, a solar cell module should be weather proof in order to withstand long-term use outside. The above conventional two-side incidence type structure uses transparent material for the rear surface member. When a transparent resin film is used as the rear surface member, water is likely to enter as compared with a lamination film with a metal foil sandwiched with plastic films. Therefore, it is necessary to take water penetration into consideration. Although a film of small water vapor transmission rate has been proposed as a transparent resin film, it still requires to be improved.

SUMMARY OF THE INVENTION

This invention was made to solve this problem and provides a solar cell module capable of improving reliability by improving moisture proofness.

Furthermore, this invention was made to improve reliability of the solar cell module by reducing water reaching to the front surface glass when the rear surface member is resin film and suppressing the sodium ions deposited from the front surface glass from reaching the front surface of the solar cell elements.

A solar cell module of this invention comprises a light transmitting member on a front surface side containing at least sodium, a rear surface resin film, a plurality of solar cell elements sealed with sealing resin between the light transmitting member on the front surface side and the rear surface resin film, and a water transmission preventing layer arranged in a position including at least an interval part between the solar cell elements adjacent each other.

The light transmitting member on the front surface side is glass and the rear surface resin film is a transparent resin film.

With the above structure, water entering though the rear surface resin film is blocked by the water transmission preventing layer and an increase of water contained in the sealing resin between the front surface glass and the solar cell elements can be prevented.

The water transmission preventing layer is formed of material with a smaller water vapor transmission rate than that of the sealing resin.

The material having a smaller water vapor transmission rate than that of the sealing resin can block water entering through the rear surface resin film.

The water transmission preventing layer is an inorganic oxide layer, a nitride layer, or a fluoride layer formed on a surface of the rear surface resin film.

The inorganic oxide layer, the nitride layer, or the fluoride layer has water barrier properties, and can function as the water transmission preventing layer.

The water transmission preventing layer is a thin plate glass bonded on a surface of the rear surface resin film.

The thin plate glass can prevent water transmission, and water entering through the rear surface resin film is blocked.

The water transmission preventing layer may be formed on a plane with the solar cell elements.

With this structure, water entering through the rear surface resin film is blocked by the solar cell elements and the water transmission preventing layer, and an increase of water contained in the sealing resin between the front surface glass and the solar cell elements.

The water transmission preventing layer may be formed so as to cover the interval part between the solar cell elements in the sealing resin.

With this structure, water entering through the rear surface resin film is blocked by the solar cell elements and the water transmission preventing layer, and an increase of water contained in the sealing resin between the front surface glass and the solar cell elements.

The water transmission preventing layer may be provided in a position corresponding to a position between the solar cell elements on an outer side of the rear surface resin film.

With the above structure, water entered though the rear surface resin film is blocked by the water transmission preventing layer and an increase of water contained in the sealing resin between the front surface glass and the solar cell elements.

The water transmission preventing layer is the rear surface resin film with the water vapor transmission rate not higher than 6.3 g/m$^2$·day.

The resin film of water vapor transmission rate not higher than 6.3 g/m$^2$·day can suppress water entrance, and an increase of water contained in the sealing resin between the front surface glass and the solar cell elements can be prevented.

The foregoing and other objects, features, aspects and advantages of the present invention will become more apparent from the following detailed description of the present invention when reviewed in conjunction with the accompanying drawings.

DESCRIPTION OF PREFERRED EMBODIMENTS

Figure 14:
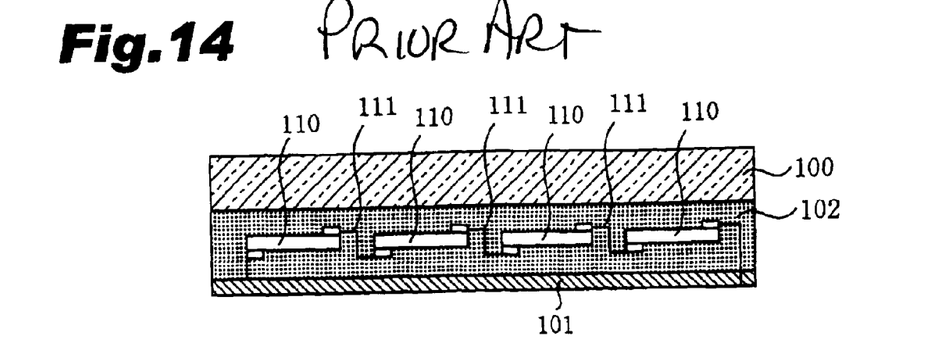
FIG. 14 is a side view of the solar cell module according to the conventional solar cell module.

First of all, this invention was made on the following conditions. A solar cell module shown in FIG. 14 including a lamination film of an aluminum foil sandwiched with polyvinyl fluoride layers, and a solar cell module only including a PVF film are prepared, and a moisture proof test (JIS C8917) on the two modules conducted to examine causes of degradation of power generation performance by water entrance. In this test, the modules are put in a thermostatic bath of 85° C., 93% RH for approximately 1000 hours and the solar cell characteristics are examined. An acceptable value of output is higher than 95%. In this test, the modules are put in the thermostatic bath for 1000 hours. The rate of change in output is 99.0% when the rear surface member is a lamination film, and the rate is 92.0% when the PVF film of 50 μm is used.

A quantity of sodium in 1 g of the resin for sealing the solar cells of the solar cell module using the lamination film is 0.3 μg/g, and that of the solar cell module using only the PVF film is 3 μg/g. The quantity of sodium relates to the rate of change in output, and as the quantity of sodium in the resin increases, the power generation performance degrades.

When the water enters the module, the sodium ions deposited from the front glass migrate in the resin containing water to reach the front surface of the solar cell element, and further diffuse inside the solar cell element to degrade the power generation performance of the solar cell. As a result, the power generation performance seems to degrade when the rear surface member is the resin film as compared with the lamination film.

This invention was made to improve reliability of the solar cell module by reducing water reaching to the front surface glass when the rear surface member is the resin film and to suppress the sodium ions deposited from the front surface glass from diffusing to the front surface of the solar cell elements.

Explanation is made on the embodiments by referring to the drawings.

Figure 1:
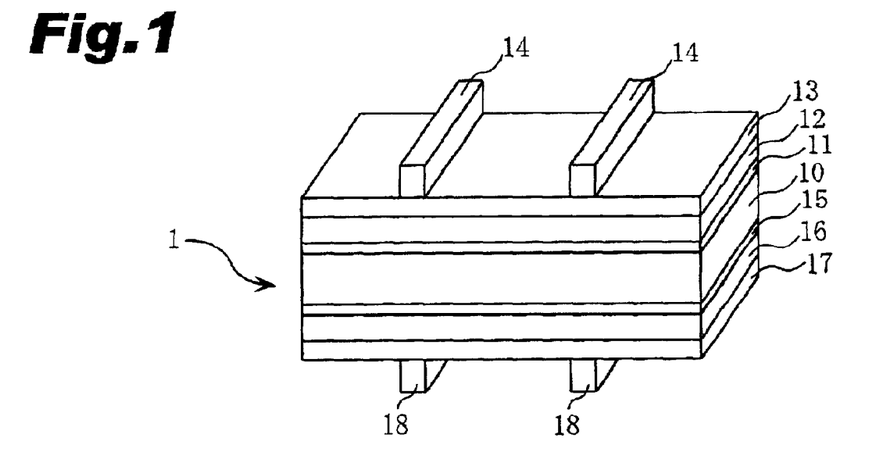
FIG. 1 is a schematic perspective view illustrating one example of a solar cell element capable of entering light from both front and rear surfaces.

One example of a solar cell element 1 used in this invention is explained by referring to FIG. 1. FIG. 1 is a schematic perspective view illustrating one example of a solar cell element capable of entering light from both front and rear surfaces. This solar cell element is so structured that intrinsic amorphous silicon is sandwiched between a single crystalline silicon substrate and an amorphous silicon layer (herein after referred as HIT structure) in order to reduce defects on the interface therebetween and improve hetero junction interface characteristics and is capable of entering light from both front and rear surfaces.

As shown in FIG. 1, the solar cell element 1 includes an n-type single crystalline silicon substrate 10, an intrinsic amorphous silicon layer 11, and a p-type amorphous silicon layer 12 formed in this order. A transparent electrode 13 on a light receiving side formed of ITO (Indium Tin Oxide) is formed on an entire surface of the p-type amorphous silicon layer 12, and a comb-shaped collector 14 of silver (Ag) or the like is formed on the transparent electrode 13 on a light receiving side. A rear surface of the substrate 10 has a BSF (Back Surface Field) structure which introduces an internal electric field on the rear surface of the substrate; a high dope n-type amorphous silicon layer 16 is formed with an intrinsic amorphous silicon layer 15 interposed on a rear surface side of the substrate 10. A transparent electrode 17 on a rear surface side formed of ITO is formed on an entire surface of the high dope n-type amorphous silicon layer 16, and a comb-shaped collector 18 of silver (Ag) or the like is formed thereon. The rear surface also has a BSF structure which the intrinsic amorphous silicon layer is sandwiched between the crystalline silicon substrate and a high dope amorphous silicon layer in order to reduce defects on the interface and improve characteristics of the hetero junction interface.

A plurality of the solar cell elements 1 of FIG. 1 are connected in series with connection member (not shown), and a solar cell module is formed by sealing the plurality of solar cell elements 1 with EVA (ethylene vinyl acetate) resin between a front surface glass 20 and a rear surface resin film 5.

Heat resistant films such as PVF (polyvinyl fluoride) film, PET (polyethylene terephthalate) film, or the like are used as the transparent resin film for the rear surface resin film 5.

Figure 2:
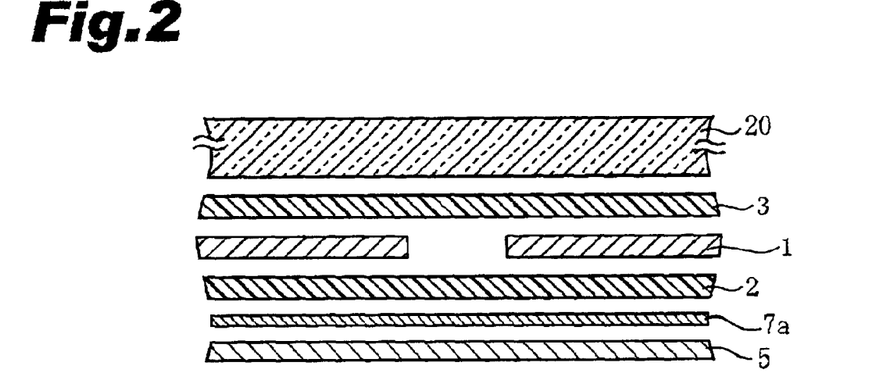
FIG. 2 is an exploded side view of the solar cell module according to the first embodiment of this invention.
Figure 3:
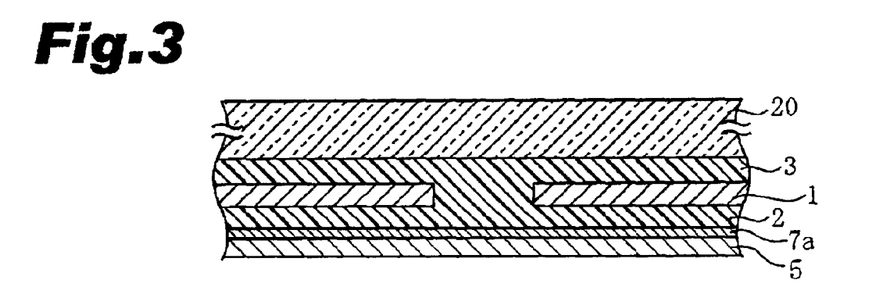
FIG. 3 is a side view of the solar cell module according to the first embodiment of this invention.

In the first embodiment illustrated in FIGS. 2, 3, SiOx or the like having a water barrier property is deposited on the entire surface of the rear surface resin film 5 of PET film 50 μm in thickness to form a water transmission preventing layer 7a is formed. The water transmission preventing layer 7a having a smaller water vapor transmission rate than that of the EVA resin can block water entrance from the rear surface resin film 5.

When a metal foil thin enough to transmit light is used as the water transmission preventing layer 7a, insulation process is provided so as to prevent short-circuit between the solar cell elements 1, 1.

An EVA resin sheet 3 of 0.6 mm in thickness is interposed between the front surface glass 20 and the solar cell elements 1. An EVA resin sheet 2 of 0.6 mm in thickness is interposed between the solar cell element 1 and the rear surface resin film 5 on the water transmission preventing layer 7a side.

Each of the layers is superimposed on the front surface glass 20, as shown in FIG. 2, and is retained in a vacuumed bath at approximately 100 Pa. Then, this lamination structure is heated to 150° C. and is pressed with a silicone sheet from the rear surface resin film 5 side by using atmospheric pressure. Through these processes, the EVA sheets 2, 3 are softened and are tentatively adhered. Then, it is retained for approximately one hour in a thermostatic bath of approximately 150° C., and the EVA sheets 2, 3 are cross-linked to form the solar cell module shown in FIG. 3.

Water entering through the rear surface resin film 5 is blocked by the water transmission preventing layer 7*a* and an increase of water in the EVA sheet 3 between the front surface glass 20 and the solar cell elements 1 can be prevented. As a result, sodium ions deposited on the front surface glass 20 are prevented from migrating so as to prevent degradation of power generation performance of the solar cell element.

A thin glass plate of 0.005–0.1 mm can be used as the water transmission preventing layer 7*a*. When this thin glass plate is used, it may be bonded to the rear surface resin film 5 of PVF film or PET film and be interposed between the rear surface resin film 5 and the EVA sheet 2.

Heat resistance films of PVF (polyvinyl fluoride), PVDF (polyvinylidene Fluoride), FEP (fluropropylene-copolymer), ETFE (2-ethylene-4-fluoroethylene-copolymer) PC (poly carbonate), PVC (polyvinyl chloride), PMMA (polymethylmethacrylate), other than PET (polyethylene terephthalate) can be used as the rear surface resin film 5. The water transmission preventing layer 7*a* is formed by depositing inorganic oxide (aluminum oxide, silicon oxide), nitride (SiN), fluoride (HgF, CaF) or the like on the heat resistance film. Because of water barrier property provided with the inorganic oxide, the layer 7*a* can function for preventing water transmission.

Figure 4:
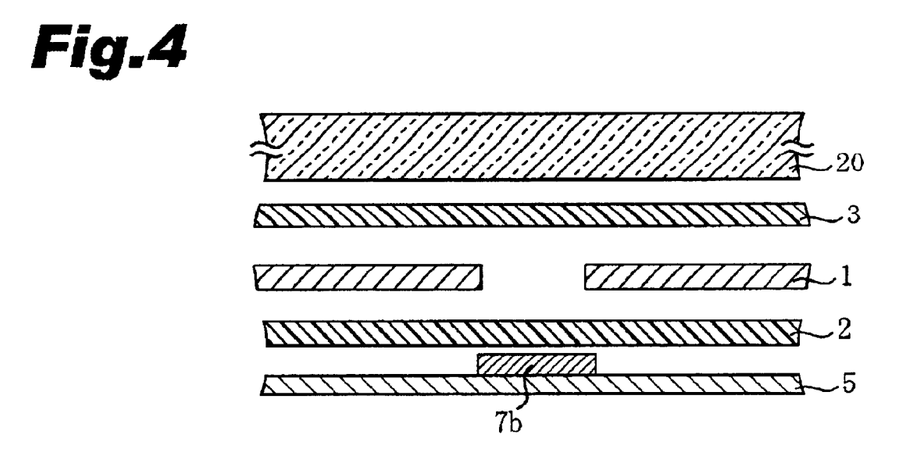
FIG. 4 is a side view of the solar cell module according to the second embodiment of this invention.
Figure 5:
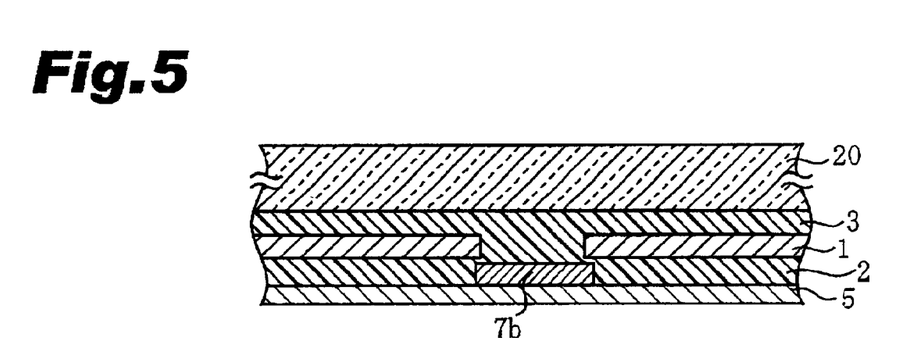
FIG. 5 is a side view of the solar cell module according to the second embodiment of this invention.

FIGS. 4, 5 explain the second embodiment of this invention. The same elements have the same reference numerals as in the first embodiment, and explanation on them is omitted.

In the first embodiment, the water transmission preventing layer is formed on the entire surface of the rear surface resin film 5. On the other hand, in the second embodiment the water transmission preventing layer 7*b* is formed on a part of the rear surface resin sheet 5 of PET film of 50 μm in thickness so as to cover an interval between the solar cell elements 1, 1. The water transmission preventing layer 7*b* is formed by depositing SiOx or the like with a water barrier property as in the case of the first embodiment. The water transmission preventing layer 7*b* becomes larger than an interval between the solar cell elements 1, 1 and covers end parts of the solar cell elements 1 by approximately 2 mm.

Then as shown in FIG. 4, the EVA resin sheet 2 is interposed between the solar cell elements 1 and the rear surface resin film 5 provided with the water transmission preventing layer 7*b*.

In the embodiment shown in FIG. 4, the EVA resin sheet 3 of 0.6 mm in thickness is interposed between the front surface glass 20 and the solar cell element 1, and the EVA sheet 2 of 0.6 mm in thickness is interposed between the solar cell element 1 and the water transmission preventing layer 7*b*.

As in the case of the first embodiment, each of the layers is superimposed on the front surface glass 20, as shown in FIG. 4, and is held in a vacuumed bath at approximately 100 Pa. Then, this lamination structure is heated to 150° C. and is pressed with a silicone sheet from the rear surface resin film 5 side by using atmospheric pressure. Through these processes, the EVA sheets 2, 3 are softened and are tentatively adhered. Then, it is retained for one hour in a thermostatic bath of approximately 150° C., and the EVA sheets 2, 3 are cross-linked to form the solar cell module shown in FIG. 5.

With this structure, entrance of water is prevented by the water transmission preventing layer 7*b* and an increase of water in the EVA resin sheet 3 between the front surface glass 20 and the solar cell elements 1 can be prevented.

Figure 6:
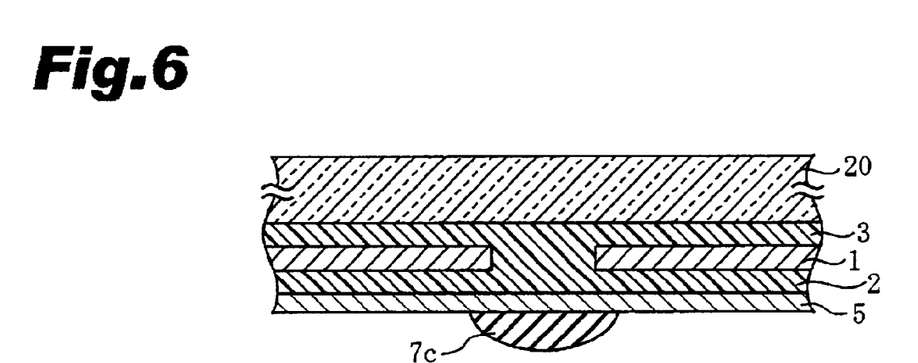
FIG. 6 is a side view of the solar cell module according to the third embodiment of this invention.

FIG. 6 explains the third embodiment of this invention. The same elements have the same reference numerals as in the first and second embodiments, and explanation on them is omitted.

Each of the layers is superimposed on the front surface glass 20, as shown in FIG. 6, and is retained in a vacuumed bath at approximately 100 Pa. Then, this lamination structure is heated to 150° C. and is pressed with a silicon sheet from the rear surface resin film 5 side by using atmospheric pressure. Through these processes, the EVA sheets 2, 3 are softened and are tentatively adhered. Then, it is retained for one hour in a thermostatic bath of approximately 150° C., and the EVA sheets 2, 3 are cross-linked to form the solar cell module.

In the third embodiment, a water transmission preventing layer 7*c* of a metal foil or butyl rubber is formed on a part corresponding to an interval between the solar cell elements 1, 1 on an outer side of the rear surface resin film 5 of PVF film of 50 μm in thickness as shown in FIG. 6. When the metal foil of aluminum or the like is used as the water transmission preventing layer 7*c*, it may be attached to the rear surface resin film 5 by using adhesive such as double sided adhesive tape. When moisture proof butyl rubber is used for the water transmission preventing layer 7*c*, the butyl rubber may be pasted to the part for forming the water transmission preventing layer 7*c*.

With the structure shown in FIG. 6, water is prevented from entering by the water transmission preventing layer 7*c* and an increase of water in the EVA sheet 3 between the front surface glass 20 and the solar cell elements 1 can be prevented.

Figure 7:
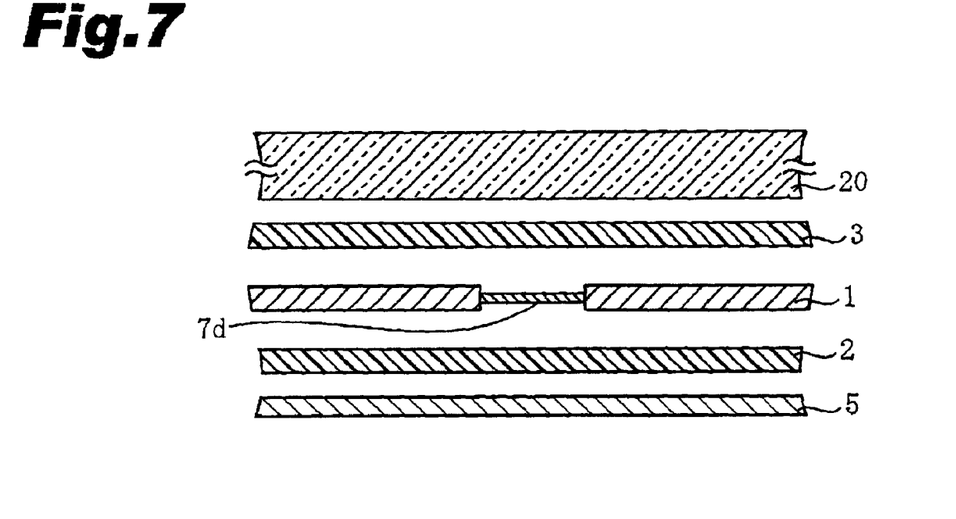
FIG. 7 is an exploded side view of the solar cell module according to the fourth embodiment of this invention.
Figure 8:
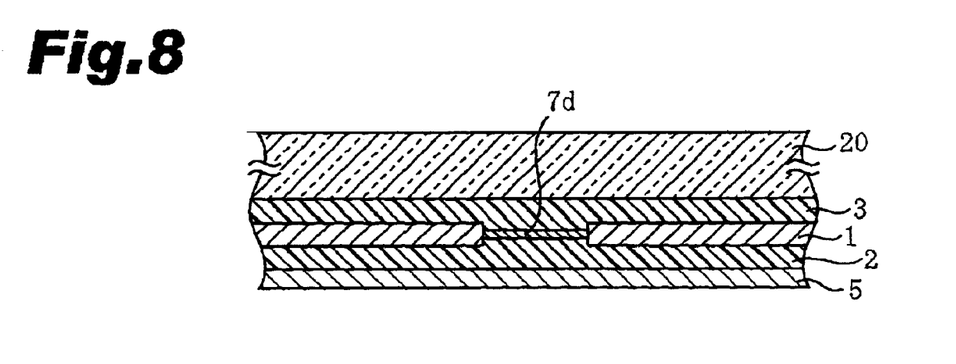
FIG. 8 is a side view of the solar cell module according to the fourth embodiment of this invention.

FIGS. 7, 8 explain the fourth embodiment of this invention. The same elements have the same reference numerals as in the first embodiment, and explanation on them is omitted.

In the fourth embodiment of FIGS. 7, 8, the water transmission preventing layer 7*d* of a metal foil or butyl rubber is interposed between the solar cell elements 1, 1. When a metal foil is used as the water transmission preventing layer 7*d*, insulation process is provided to prevent short-circuit between the solar cell elements 1, 1.

An EVA resin sheet 3 of 0.6 mm in thickness is interposed between the front surface glass 20 and the solar cell elements 1. An EVA resin sheet 2 of 0.6 mm in thickness is interposed between the solar cell element 1 and the rear surface resin film 5 of PVF film of 50 μm in thickness.

Each of the layers is superimposed on the front surface glass 20, as shown in FIG. 7, and is held in a bath at approximately 100 Pa. Then, this lamination structure is heated to 150° C. and is pressed with a silicone sheet from the rear surface resin film 5 side by using atmospheric pressure. Through these processes, the EVA sheets 2, 3 are softened and are tentatively adhered. Then, it is retained for one hour in a thermostatic bath of approximately 150° C., and the EVA sheets 2, 3 are cross-linked to form the solar cell module shown in FIG. 8.

With the structure of FIG. 8, water entering through the rear surface resin film 5 is blocked by the solar cell element 1 and the water transmission preventing layer 7d, and an increase of water in the EVA sheet 3 between the front surface glass 20 and the solar cell elements 1 can be prevented. As a result, a sodium ion deposited on the front surface glass 20 is prevented from migrating so as to prevent degradation of power generation performance of the solar cell element.

When a metal foil of aluminum is used as the water transmission preventing layer 7d and the reflectivity of a surface of the metal foil increases, light incident between the solar cell elements 1, 1 reflects on the surface of the metal foil, further reflects on a surface of the front surface glass 20 through the EVA sheet 3 again, and enters in the solar cell elements 1, 1. As a result, power generation properties of the solar cell elements 1, 1 are improved.

Figure 9:
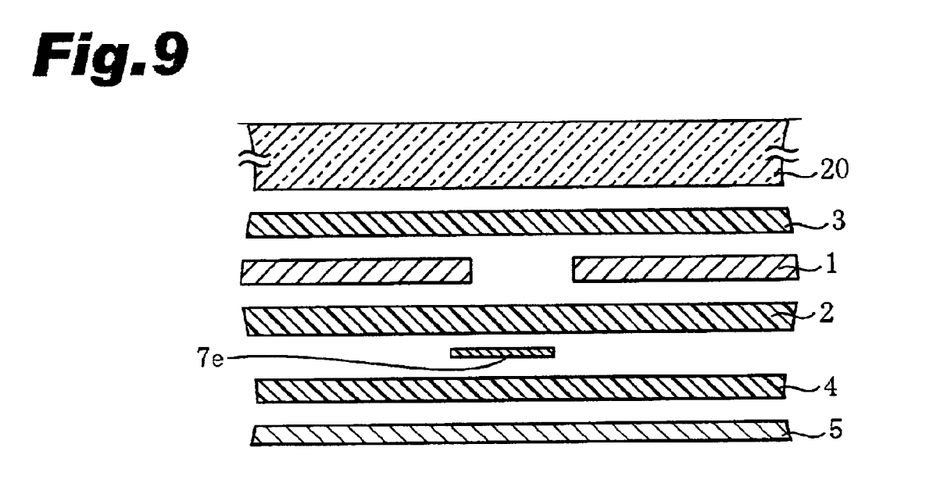
FIG. 9 is an exploded side view of the solar cell module according to the fifth embodiment of this invention.
Figure 10:
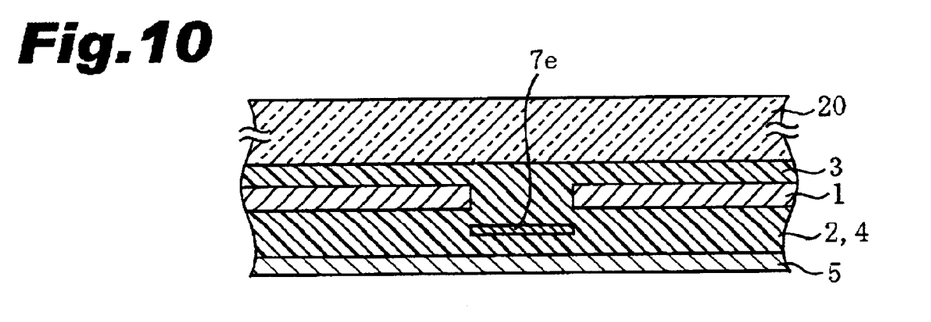
FIG. 10 is a side view of the solar cell module according to the fifth embodiment of this invention.

FIGS. 9, 10 explain the fifth embodiment of this invention. The same elements have the same reference numerals as in the first embodiment, and explanation on them is omitted.

As shown in FIG. 9, two EVA resin sheets 2, 4 are interposed between the rear surface resin film 5 of PVF film of 50 μm in thickness and the solar cell elements 1. A water transmission preventing layer 7e of a metal foil of aluminum or the like is interposed between the resin sheets 2, 4 so as to cover the interval between the solar cell elements 1, 1. The water transmission preventing layer 7e is larger than the interval between the solar cell elements 1, 1 so as to cover end parts of the solar cell elements 1 by approximately 2 mm.

In the embodiment shown in FIG. 10, an EVA resin sheet of 0.6 mm in thickness is interposed between the front surface glass 20 and the solar cell element 1, and the EVA sheets 2, 4 of 0.6 mm in thickness are interposed between the solar cell element 1 and the rear surface resin film 5.

As in the case of the fourth embodiment, each of the layers is superimposed on the front surface glass 20, as shown in FIG. 9, and is held in a bath at approximately 100 Pa. Then, this lamination structure is heated to 150° C. and is pressed with a silicone sheet from the rear surface resin film 5 side at atmospheric pressure. Through these processes, the EVA sheets 2, 4, 3 are softened and are tentatively adhered. Then, it is retained for approximately one hour in a thermostatic bath of approximately 150° C., and the EVA sheets 2, 4, 3 are cross-linked to form the solar cell module shown in FIG. 10.

Water entering through the rear surface resin film 5 is blocked by the water transmission preventing layer 7e and a solar cell element 1, and an increase of water in the EVA sheet 3 between the front surface glass 20 and the solar cell elements 1 can be prevented. As a result, a sodium ion deposited on the front surface glass 20 is prevented from migrating so as to prevent degradation of power generation performance of the solar cell element.

Figure 11:
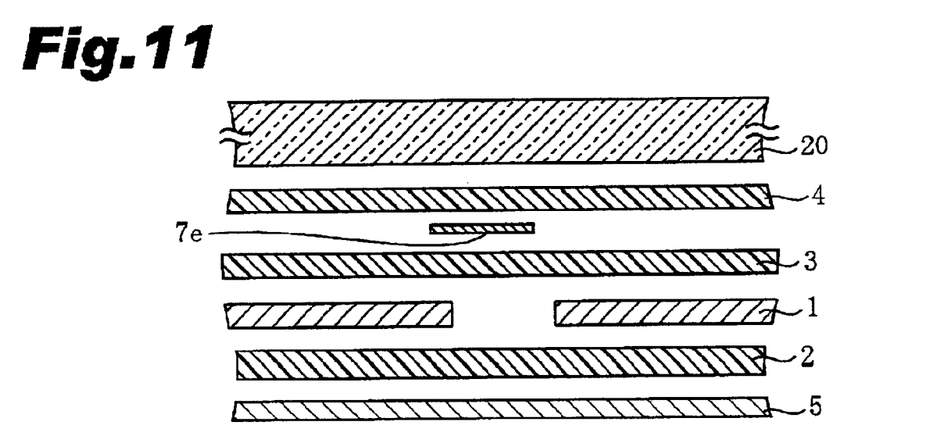
FIG. 11 is an exploded side view of the solar cell module according to the sixth embodiment of this invention.
Figure 12:
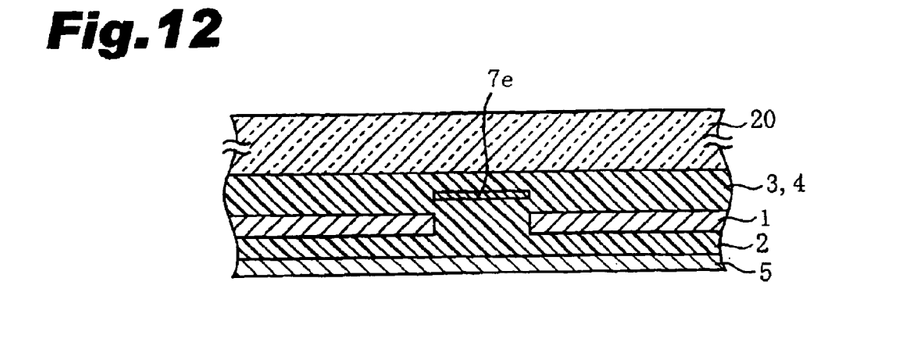
FIG. 12 is a side view of the solar cell module according to the sixth embodiment of this invention.

FIGS. 11, 12 explain the sixth embodiment of this invention. The same elements have the same reference numerals as in the first, fourth, and fifth embodiments, and explanation on them is omitted.

Then as shown in FIG. 11, two EVA resin sheets 3, 4 are interposed between the front surface glass 20 and the solar cell elements 1. The water transmission preventing layer 7e of a metal foil of aluminum or the like is interposed between the resin sheets 3, 4 so as to cover the interval between the solar cell elements 1, 1 by approximately 2 mm.

In the embodiment shown in FIG. 11, two EVA resin sheets 3, 4 of 0.6 mm in thickness are interposed between the front surface glass 20 and the solar cell element 1, and the EVA sheet 2 of 0.6 mm in thickness is interposed between the solar cell element 1 and the rear surface resin film 5 of PVF film of 50 μm in thickness.

As in the case of the fourth and fifth embodiments, each of the layers is interposed on the front surface glass 20, as shown in FIG. 11, and is held in a bath at approximately 100 Pa. Then, this lamination structure is heated to 150° C. and is pressed and attached with a silicone sheet from the rear surface resin film 5 side by using atmospheric pressure. Through these processes, the EVA sheets 2, 4, 3 are softened and are tentatively adhered. Then, it is retained for one hour in a thermostatic bath of approximately 150° C., and the EVA sheets 2, 4, 3 are cross-linked to form the solar cell module shown in FIG. 12.

In the structure of FIG. 12, the water entering through the rear surface resin film 5 is blocked by the solar cell element 1 and the water transmission preventing layer 7e, and increase of water in the EVA sheet 3 between the front surface glass 20 and the solar cell elements 1 can be prevented. As a result, a sodium ion deposited on the front surface glass 20 is prevented from migrating so as to prevent degradation of power generation performance of the solar cell element.

A distance between the front surface glass 2 and the solar cell element 1 can be great as compared with the solar cell module of the fourth embodiment; for example the distance can be doubled of one which has the single EVA sheet of 0.6 mm. As a result, time for the sodium ions deposited from the front surface glass 20 to reach to the solar cell element 1 can take longer. Therefore, time taken until starting degradation of power generation performance of the solar cell element can be prolonged and a solar cell module of high reliability capable of withstanding long-term use in the outside can be provided.

Figure 13:
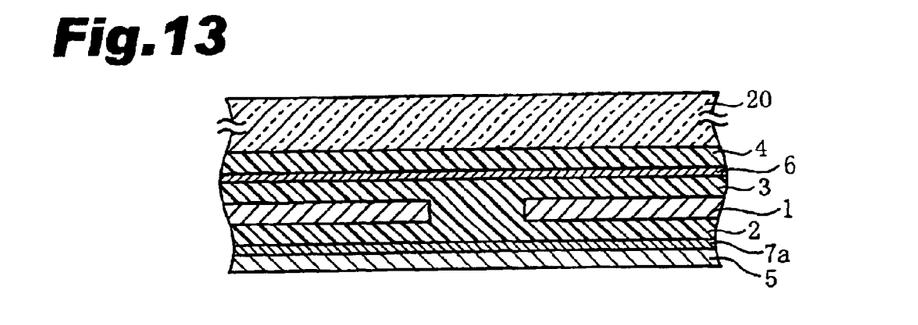
FIG. 13 is a side view of the solar cell module according to the seventh embodiment of this invention.

FIG. 13 explains the seventh embodiment of this invention. The same elements have the same reference numerals as in the first embodiment, and explanation on them is omitted.

In the embodiment illustrated by FIG. 13, a PET film 6 of 50 μm in thickness which is a resin layer of smaller water vapor transmission rate than that of sealing resin and is not provided in the first embodiment illustrate by FIG. 3, is provided between the EVA sheets 3, 4 on a front surface glass 20 side. The same elements as in FIG. 3 have the same reference numerals.

The resin layer of smaller water vapor transmission rate than that of the sealing resin interposed between the front surface glass 20 and the solar cell element 1 can suppress sodium ion deposited from the front surface glass 20 from reaching to the solar cell elements 1, and degradation of power generation performance of the solar cell elements 1 can be prevented.

The solar cell module of this invention and a comparison sample are subjected to a moisture proof test (JIS C8917). In this test, the samples are put in a thermostatic bath of 85° C., humidity of 93% for approximately 1000 hours and characteristics of the solar cells are examined. An output value of more than 95% is an acceptable line.

Sample No. 1 is one that uses a lamination film which an aluminum foil, as a rear surface material, is sandwiched by PVF in order to prevent water entrance from a rear surface and seals the solar cell elements by using an EVA sheet between the front surface glass 20. The No. 2 sample is one that uses a PVF film as a rear surface material. The No. 3–9 samples are ones that have the structures respectively illustrated in the first through seventh embodiments of this invention. The conditions of each of the samples are the same except for the condition shown in the table and the solar cell element 1 has the HIT structure of two-side incidence type.

The above samples are put in the thermostatic bath of the above conditions and the moisture proof test is conducted. The results are shown in the table 1. The table also shows the results of measurement of an amount of sodium (Na) in 1 g of the sealing resin after 1000 hours.

TABLE 1

| | | Rate of change in output characteristic [%] | | | | Na quantity/ EVA |
|---|---|---|---|---|---|---|
| | | Pmax | Voc | Isc | F.F. | |
| 1 | Rear surface resin film of PVF/Al/PVF lamination | 99.0 | 99.8 | 99.9 | 99.3 | 0.3 μg/g |
| 2 | Rear surface resin film of PVF film (50 μm) | 92.0 | 98.2 | 99.3 | 94.3 | 3.0 μg/g |
| 3 | Rear surface resin film of PET film (50 μm), SiOx layer formed on the rear surface resin film | 97.2 | 99.3 | 99.6 | 98.3 | 0.6 μg/g |
| 4 | Rear surface resin film of PET film (50 μm), SiOx layer formed between solar cell elements | 96.9 | 99.2 | 99.5 | 98.2 | 0.7 μg/g |
| 5 | Rear surface resin film of PVF film (50 μm), water proof butyl rubber formed to cover solar cell elements by 2 mm on an outer side of the rear surface resin film | 96.8 | 99.2 | 99.5 | 98.1 | 0.7 μg/g |
| 6 | Rear surface resin film of PVF film (50 μm), aluminum foil (50 μm) interposed between the solar cell elements | 97.5 | 99.3 | 99.6 | 98.6 | 0.5 μg/g |
| 7 | Rear surface resin film of PVF film (50 μm), aluminum foil (50 μm) interposed between the the solar cell element and the rear surface resin film to cover the solar cell elements by 2 mm | 98.5 | 99.6 | 99.8 | 99.1 | 0.4 μg/g |
| 8 | Rear surface resin film of PVF film (50 μm), aluminum foil (50 μm) interposed between the solar cell element and the front surface glass to cover the solar cell elements by 2 mm | 98.4 | 99.6 | 99.8 | 99.0 | 0.4 μg/g |
| 9 | Rear surface resin film of PET film (50 μm), a SiOx layer formed thereon, and a PET film (50 μm) interposed between the front EVA resin sheets (respectively 0.4 mm) | 99.0 | 99.8 | 99.9 | 99.3 | 0.1 μg/g |

From the table 1, it is found that the performance of the solar cell module of this invention using the transparent resin film as a rear surface resin film and the performance of one using the lamination film as a rear surface resin film are not different greatly. Either of them can satisfy higher than 95% level of the initial properties, and can achieve the JIS standard.

The sealing resin of the above embodiments is EVA, and silicone resin, poly vinyl chloride, PVB (poly vinyl butyral), or polyurethane can be also used.

Explanation is made on the water vapor transmission rate of each of the material. The water vapor transmission rate is measured by Mocon method (JIS Z 0208-73).

The water vapor transmission rate of the EVA sheet of 0.6 mm is 63 g/m²·day, the PET film of 50 μm is 12.6 g/m²·day, the PVF film of 50 μm is 15 g/m²·day.

The water vapor transmission rate is inversely proportional to the thickness; for example when the thickness is doubled, the water vapor transmission rate is halved. Therefore, when the thickness of the EVA sheet is 1.0 mm, the water vapor transmission rate is 37.8 g/m²·day.

The transmission of water can be suppressed by increasing a thickness of the resin layer between the front surface glass 20 and the solar cell element 1, and the rear surface resin film and the solar cell element 1, and the thickness of the rear surface resin film.

The transmission type resin film is used in the two-side incidence type solar cell. Samples using PET film and PVF film as the transmission type resin film are prepared and the moisture proof test is conducted. The samples are put in a thermostatic bath of 85° C., 93% RH for approximately 1000 hours and the characteristics of the solar cells are examined. The output value of higher than 95% is an acceptable standard. The results are shown in the table 2. The sample used is one that adds a lamination film, as the rear surface material 5, sandwiching an aluminum foil with the PVF film in order to prevent water entrance from the rear surface to sample No. 1. The thickness of the EVA sheet 2 on the rear surface side is 0.6 mm and the thickness of the EVA sheet on the front surface side is 0.6 mm.

Sample No.2 is one that has the same structure as the above conventional samples except that the rear surface material 5 is a PVF film of 50 μm in thickness and the EVA sheet on the front surface side is 0.6 mm in thickness. Sample No.3 is one that has the same structure as the above conventional samples except that the rear surface material 5 is a PET film of 50 μm in thickness and the EVA sheet on the front surface side is 0.6 mm in thickness. The sample No.4 is one that has the same structure as the above conventional samples except that the rear surface material 5 is a PET film of 100 μm in thickness and the EVA sheet on the front surface side is 0.6 mm in thickness. Sample No.5 is one that has the same structure as the above conventional samples except that the rear surface material 5 is a PET film of 100 μm in thickness and the EVA sheet of 1.0 mm on the front surface side is formed of two sheets respectively of 0.6 mm and 0.4 mm in thickness. Sample No. 1 is one of a single-side power generation module which light is incident from only a side of the front surface glass 20, and the other samples are ones of two-side incidence type module. Degradation from the initial characteristics of the samples is watched. The measurement of an amount of sodium (Na) in 1 g of the sealing resin is also shown.

TABLE 2

| | | Rate of change in output characteristic [%] | | | | Na quantity/ EVA |
|---|---|---|---|---|---|---|
| | | Pmax | Voc | Isc | F.F. | |
| 1 | Conventional structure (front EVA sheet of 0.6 mm) | 99.0 | 99.8 | 99.9 | 99.3 | 0.3 μg/g |
| 2 | Rear surface resin film of PVF film (50 μm), front | 92.0 | 98.2 | 99.3 | 94.3 | 3.0 μg/g |

TABLE 2-continued

| | | Rate of change in output characteristic [%] | | | | Na quantity/ EVA |
|---|---|---|---|---|---|---|
| | | Pmax | Voc | Isc | F.F. | |
| 3 | Rear surface resin film of PET film (50 μm), front EVA sheet of 0.6 mm | 93.5 | 98.5 | 99.4 | 95.5 | 2.3 μg/g |
| 4 | Rear surface resin film of PVF film (100 μm), front EVA sheet of 0.6 mm ··· comparison with No. 3 sample | 95.5 | 99.1 | 99.5 | 96.9 | 1.2 μg/g |
| 5 | Rear surface resin film of PET film (50 μm), front EVA sheet of 1.0 mm ··· comparison with No. 3 sample | 95.8 | 99.2 | 99.5 | 97.1 | 1.0 μg/g |

It is found from the table 2 that Sample No. 4 using the PET film of 100 μm can maintain higher than 95% level of the initial characteristics, but Samples No. 2 and 3 can not maintain higher than 95% level of the initial characteristics. When the thickness of the EVA sheet on the front surface side increases, the sample as in the case of the No. 5 can maintain 95% of the initial characteristics.

The water vapor transmission rate of the PET film of 100 μm is 6.3 g/m²·day, and the PVF film of 50 μm is 15.0 g/m²·day.

It can be said from the table 2 that the two-side incidence type structure prevents water transmission from the rear surface side. The water transmission preventing layer of this invention can prevent deposition of a sodium ion from the front surface glass and prevent degradation of power generation performance of the solar cell element. When the thickness of the rear surface resin film 5 increases and the water vapor transmission rate of it is less than 6.3 g/m²·day, it can function as a water transmission preventing layer.

The above embodiments uses the solar cell element of the HIT structure, but other types of solar cell modules using other crystalline solar cell elements and amorphous solar cell elements are applicable.

As described above, this invention can provide a solar cell module of high reliability capable of suppressing deposition of sodium ion from the front surface glass, extending time of degrading power generation performance of the solar cell element, and withstanding long-term use outside.

Although the present invention has been described and illustrated in detail, it should be clearly understood that the description discloses examples of different embodiments of the invention and is not intended to be limited to the examples or illustrations provided. Any changes or modifications within the spirit and scope of the present invention are intended to be included, the invention being limited only by the terms of the appended claims.

What is claimed is:

1. A solar cell module comprising:

a light transmitting member on a front surface side containing at least sodium, a rear surface resin film, a plurality of solar cell elements sealed with sealing resin between the light transmitting member on the front surface side and the rear surface resin film, and a water transmission preventing layer between the light transmitting member and the rear surface resin film wherein the water transmission preventing layer is a plate glass bonded on a surface of the rear surface resin film.

2. A solar cell module, comprising:

a light transmitting member on a front surface side containing at least sodium, a rear surface resin film, a plurality of solar cell elements sealed with sealing resin between the light transmitting member on the front surface side and the rear surface resin film, and a water transmission preventing layer arranged in a position including at least an interval part between the solar cell elements adjacent each other, wherein the water transmission preventing layer is formed on a plane with the solar cell elements.

3. A solar cell module comprising:

a light transmitting member on a front surface side containing at least sodium, a rear surface resin film, a plurality of solar cell elements sealed with sealing resin between the light transmitting member on the front surface side and the rear surface resin film, and a water transmission preventing layer between the light transmitting member and the rear surface resin film, wherein the water transmission preventing layer is a plate glass having a thickness between 0.005 and 0.1 mm bonded on the rear surface resin film.

* * * * *